United States Patent [19]

Tondreault

[11] Patent Number: 5,302,133
[45] Date of Patent: Apr. 12, 1994

[54] ELECTRICAL CONNECTOR SOCKET WITH DAUGHTERCARD EJECTOR

[75] Inventor: Robert J. Tondreault, Louisville, Ky.

[73] Assignee: Robinson Nugent, Inc., New Albany, Ind.

[21] Appl. No.: 60,308

[22] Filed: May 11, 1993

[51] Int. Cl.$^5$ ............................................. H01R 13/00
[52] U.S. Cl. .................................................... 439/157
[58] Field of Search ................................ 439/152-160

[56] References Cited

U.S. PATENT DOCUMENTS

| | | |
|---|---|---|
| 2,987,693 | 6/1961 | Wamsley . |
| 3,150,906 | 9/1964 | Chambon et al. . |
| 3,271,626 | 9/1966 | Howrilka . |
| 3,360,689 | 12/1967 | Haury . |
| 3,853,379 | 12/1974 | Goodman et al. . |
| 4,057,879 | 11/1977 | Eigenbrode . |
| 4,070,081 | 1/1978 | Takahashi . |
| 4,075,444 | 2/1978 | Hollingsead et al. . |
| 4,197,572 | 4/1980 | Aimar . |
| 4,241,966 | 12/1980 | Gomez . |
| 4,582,378 | 4/1986 | Fruchard . |
| 4,603,375 | 7/1986 | Miller et al. . |
| 4,638,405 | 1/1987 | Smith . |
| 4,698,024 | 10/1987 | Maxwell . |
| 4,780,792 | 10/1988 | Harris et al. . |
| 4,836,790 | 6/1989 | Narita . |
| 4,898,540 | 2/1990 | Saito . |
| 4,973,255 | 11/1990 | Rudoy . |
| 4,990,097 | 2/1991 | Billman et al. . |
| 4,996,631 | 2/1991 | Freehauf . |
| 5,013,264 | 5/1991 | Tondreault . |
| 5,057,029 | 10/1991 | Noorily . |
| 5,066,241 | 11/1991 | Hills . |
| 5,074,800 | 12/1991 | Sasao et al. . |
| 5,106,315 | 4/1992 | Billman et al. . |
| 5,147,211 | 9/1992 | Tondreault et al. . |
| 5,163,847 | 11/1992 | Regnier . |
| 5,211,568 | 5/1993 | Yamada et al. . |

*Primary Examiner*—Joseph H. McGlynn
*Attorney, Agent, or Firm*—Barnes & Thornburg

[57] ABSTRACT

An electrical connector is provided for receiving a daughtercard having a plurality of conductive surfaces formed thereon. The connector includes a socket having a first end and a second end. An ejector is coupled to the first end of the socket. The ejector includes spring arms for retaining the daughtercard in the socket upon insertion of the daughtercard into the socket. A post is coupled to the second end of the socket in a fixed position relative to the socket to guide insertion of the daughtercard into the socket. The post is formed to include a pair of spring arms for engaging opposite sides of the daughtercard adjacent the post to retain the daughtercard within the socket. The ejector ejects an end of the daughtercard adjacent the ejector out of the socket upon movement of the ejector relative to the socket while leaving an opposite end of the daughtercard adjacent the post in the elongated slot of the socket.

30 Claims, 6 Drawing Sheets

ELECTRICAL CONNECTOR SOCKET WITH DAUGHTERCARD EJECTOR

BACKGROUND AND SUMMARY OF THE INVENTION

The present invention relates to an electrical connector socket having an ejector mechanism for removing a daughtercard or module from the socket. More particularly, the present invention relates to an improved electrical connector which provides a retention force when the daughtercard is inserted into the socket and also permits the daughtercard to be easily ejected from the socket when desired.

It is well known to provide electrical connector sockets, such as Single In-line Memory Module (SIMM) sockets, for interconnecting a first printed circuit board or mother board to a second printed circuit board or daughtercard. Typically, the sockets are formed to include an elongated slot and a plurality of electrical terminals coupled to the housing adjacent to the slot. When the daughtercard is inserted into the slot of the socket, conductive surfaces on the daughtercard engage the terminals to couple the daughtercard to the socket electrically. The terminals are also coupled to conductive traces on the mother board so that when the daughtercard is inserted into the socket, the daughtercard is electrically coupled to the mother board. For examples of SIMM socket configurations see, for example, U.S. Pat. No. 5,013,264 to Tondreault and U.S. Patent Application Serial No. 07/759,409, owned by the assignee of the present invention, and incorporated herein by reference.

One problem associated with conventional electrical connectors is that it is often difficult to extract a daughtercard that is held in a socket formed in an electrical connector. It is understood that a plurality of sockets may be located adjacent each other with daughtercards in each of the sockets. In such tight quarters it is often difficult for a technician to remove a selected daughtercard from the connector socket manually by hand or using a tool. Unless precautions are taken, the daughtercard can be damaged during extraction of the daughtercard from the socket. Therefore, it is desirable to provide an ejector mechanism coupled to the socket to facilitate ejection of the daughter card from the socket.

It is known to provide ejectors coupled to the sockets to assist with the removal of daughtercards from the socket. One such ejector is disclosed in U.S. Pat. No. 5,147,211 to Tondreault et al. The '221 patent discloses an ejector for selectively ejecting one of first and second daughtercards located in adjacent elongated slots of a socket. The device disclosed in the '211 patent therefore provides means for selectively ejecting first and second daughtercards in a dual-row socket.

The present invention provides an improved design for an ejector for a single row socket. It is known to provide ejectors for such single row sockets. See, for example, U.S. Pat. No. 4,990,097 to Billman, et al. The '097 patent discloses a connector having extraction members which can be lifted upwardly relative to the socket to permit a circuit board to be withdrawn from the socket. However, it is often difficult to access the extraction members. A great deal of room is required beyond the edge of the extraction members to permit a technician to grip under a ledge of the extraction members and lift. In addition, a relatively large amount of force must be applied to the extraction members to remove the circuit board from the socket.

Another single row socket ejector apparatus is disclosed in U.S. Pat. No. 5,074,800 to Sasao et al. The Sasao '800 patent discloses first and second ejection levers pivotably coupled to opposite ends of a connector housing. In order to insert a printed circuit board into a slot of housing, both ejection levers are pivoted outwardly into to an ejection position. As the board is inserted downwardly into the slot of the housing and engages the ejection levers, the ejection levers rotate toward a locking position. A user must hold and guide the circuit board carefully until the board is above the slot in an aligned position so that the contacts on the board mate with the contact terminals in the housing. Having ejection levers on both ends of housing provides a substantial amount of end play and make it difficult to align board in the correct position relative to housing.

A problem associated with conventional sockets is that the daughtercard tends to dislodge from the socket during handling or during motor or fan vibration. Such dislodging can cause intermittent or failed signal paths between the daughtercard and the mother board.

An object of the present invention is to facilitate ejection of a daughtercard from a socket, while improving the retention force on the daughtercard to retain the daughtercard in the socket and while facilitating alignment of the daughtercard with the socket during insertion of the daughtercard into the socket.

According to one aspect of the present invention, an electrical connector is provided for receiving a daughtercard having a plurality of conductive surfaces formed thereon. The connector includes a socket having a first end and a second end. The socket is formed to include an elongated slot extending between the first and second ends for receiving the daughtercard therein and a plurality of electrical terminals for engaging the plurality of conductive surfaces formed the daughtercard for electrically coupling the daughtercard to the socket. The connector also includes a post coupled to the second end of the socket in a fixed position relative to the socket to guide insertion of the daughtercard into the socket so that the plurality of conductive surfaces formed the daughtercard are aligned with the plurality of electrical terminals of the socket. The post is formed to include means for engaging opposite sides of the daughtercard adjacent the post to retain the daughtercard within the socket. The connector further includes an ejector coupled to the first end of the socket. The ejector includes means for retaining the daughtercard in the socket upon insertion of the daughtercard into the socket and means for ejecting an end of the daughtercard adjacent the ejector out of the elongated slot upon movement of the ejector relative to the socket while leaving an opposite end of the daughtercard adjacent the post in the elongated slot of the socket.

In the illustrated embodiment, the retaining means of the ejector includes first and second spring arms for engaging opposite sides of the daughtercard upon insertion of the daughtercard into the socket. The first and second spring arms of the ejector each include a head portion configured to enter an aperture formed in the daughtercard adjacent the ejector from opposite sides of the daughtercard. The head portions of the ejector arms include a ramp shaped edge surface configured to engage the daughtercard and apply a retention force normal to the daughtercard. The head portions of the ejector arms also include a bottom surface for applying a retention force against the daughtercard downwardly into said elongated slot of the socket. The head portions of the ejector arms further include side ramped surfaces to force the first and second arms of the ejector apart automatically during insertion of the daughtercard into socket or during ejection of the daughtercard from the socket.

Also in the illustrated embodiment, the ejecting means includes means for engaging the daughtercard to force an end of the daughtercard adjacent the first end of the socket out of the elongated slot upon movement of the ejector relative to the socket. The ejector is pivotably coupled to the first end of the socket and movable from an upright retention position in which the retaining means engages opposite sides of the daughtercard to retain the daughtercard in the socket to an outwardly pivoted ejection position so that the ejecting means forces said end of the daughtercard adjacent the ejector out of the elongated slot. Advantageously, the spring arms of the ejector are formed to include means for permitting the daughtercard to be inserted into the socket with the ejector in either its upright retention position or its outwardly pivoted ejection position.

The engaging means of the post includes a pair of spring arms projecting away from the post for engaging opposite sides of the daughtercard adjacent the second end of the socket to retain the daughtercard within the socket. The arms of the post each include a head portion configured to enter an aperture formed in the daughtercard for engaging opposite sides of the daughtercard to retain and stabilize the daughtercard in the socket. The head portions of the post arms have a configuration identical to the head portions of the ejector. Therefore, the head portions of the post arms include a ramp shaped edge surface configured to engage the daughtercard and apply a force normal to the daughtercard and a bottom surface for applying a force against the daughtercard downwardly into said elongated slot of the socket. The head portions of the post arms also include side ramped surfaces to force the post arms apart automatically during insertion of the daughtercard into the socket or during ejection of the daughtercard from the socket.

Insertion of the daughtercard into the socket of the present invention is simple. The daughtercard is first aligned with the socket using the fixed post as a guide. This is an advantage over the prior art device illustrated in the '800 patent discussed above in which the card may become misaligned due to the end play caused by having ejection levers at both ends of the socket. As the daughtercard is inserted into the socket of the present invention, the bottom surface of the daughtercard engages the bottom surface of the ejector and causes rotation of ejector about its pivot axis. The ramped surfaces on the heads of the ejector cause the arms of the ejector to move apart automatically as they contact a side edge of the daughtercard. There is no need to exert an external force on the ejector to cause the ejector to pivot to the retention position in which the ramped heads of the ejector enter the aperture from opposite sides of the daughtercard to stabilize and retain the daughtercard in the socket. In fact, the daughtercard can be inserted with the ejector in its upright retention position. The heads of the arms formed coupled to the fixed post enter the aperture at the opposite end of the daughtercard. Flat bottom surfaces on heads of the arms of the ejector and the post prevent movement of daughtercard upwardly out of the socket.

When it is desired to remove the daughtercard from the socket, the ejector is rotated about its pivot axis. This movement forces the end of the daughtercard adjacent the ejector to rotate out of the socket. The ramped surfaces of the heads of the ejector engage a side wall defining the aperture in the daughtercard to force the arms of the ejector outwardly to disengage the heads of the ejector from the aperture. After the ejector pushes the end of the daughtercard adjacent the ejector out of the socket, an operator can grab the raised corner of the daughtercard and "peel" the daughtercard the rest of the way out the socket by continuing to rotate daughtercard using the fixed post to provide leverage.

Additional objects, features, and advantages of the invention will become apparent to those skilled in the art upon consideration of the following detailed description of a preferred embodiment exemplifying the best mode of carrying out the invention as presently perceived.

BRIEF DESCRIPTION OF THE DRAWINGS

The detailed description particularly refers to the accompanying figures in which.

DETAILED DESCRIPTION OF THE DRAWINGS

Figure 1:
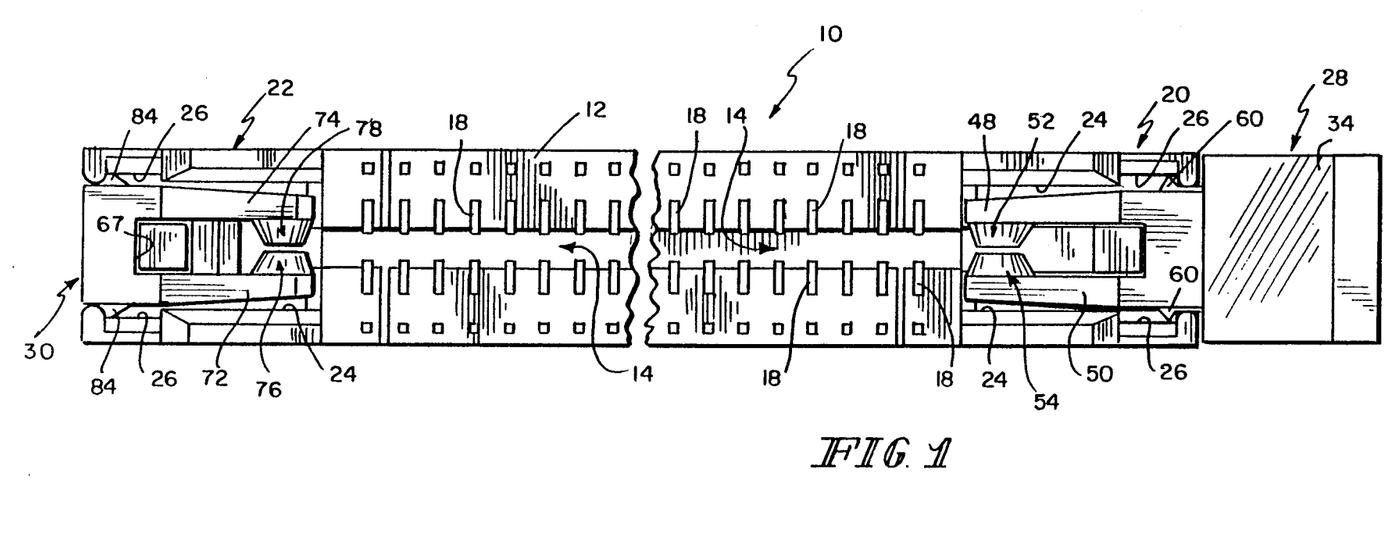
FIG. 1 is a top plan view with portions broken away illustrating a socket of the present invention including an elongated slot for receiving the daughtercard therein, a plurality of contacts for engaging conductive surfaces on the daughtercard, an ejector apparatus pivotably coupled to one end of the socket, and a fixed post coupled to a second, opposite end of the socket for retaining an end of the daughtercard opposite from the ejector in the socket.

Referring now to the drawings, FIG. 1 illustrates a socket 10 of the present invention. Socket 10 includes a housing 12 formed to include an elongated slot 14 therein for receiving a daughtercard 16. Socket 10 includes a plurality of contacts 18 for engaging conductive surfaces on daughtercard 16 when daughtercard 16 is inserted into socket 10. Socket 10 includes a first end 20 and an opposite second end 22 spaced apart from first end 20. First and second ends 20 and 22 have an identical configuration including a first opening 24 and a second opening 26. An ejector 28 is pivotably coupled to first end 20 of socket 10. A fixed retention post 30 is coupled to second end 22 of socket 10.

Figure 2:
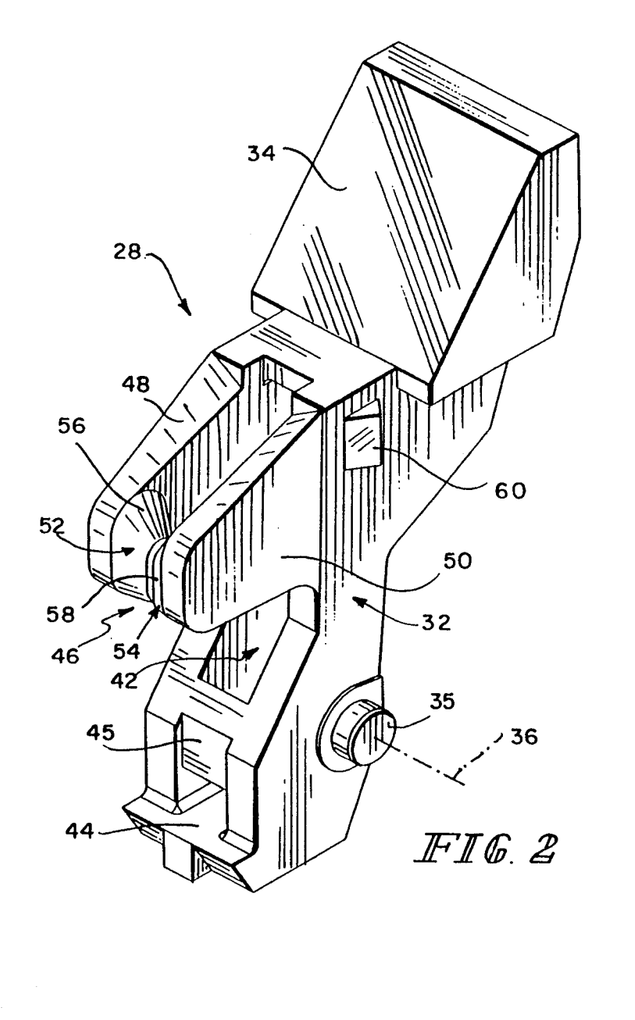
FIG. 2 is a perspective view illustrating the ejectro apparatus of the present invention.

FIG. 2 illustrates ejector 28 which is configured to retain and to eject daughtercard 16 from socket 10. Ejector 28 includes a body portion 32 and a head 34 formed integrally with body portion 32 to facilitate pivotal movement of ejector 28. Head 34 provides a "finger shelf" on which to push when actuating ejector 28. A pair of axles 35 are formed on opposite sides on body portion 32. Axles 35 define a pivot axis 36 which is perpendicular to elongated slot 14 formed along a longitudinal axis of socket 10. Body 32 is formed to include a slot 42 therein for receiving an end edge portion of daughtercard 16 as daughtercard 16 is inserted into socket 10. A bottom surface 44 of ejector 28 is configured to engage a bottom surface 46 of daughtercard 16 as daughtercard 16 is inserted into socket 10. A cross member 45 is formed across slot 42 to provide a polarization member as discussed below.

Body portion 32 of ejector 28 also includes a pair of flexible spring arms 48 and 50 that project away from body portion 32. Arms 48 and 50 are each formed to include tapered heads 52 and 54, respectively, which engage opposite sides of daughtercard 16 to retain daughtercard 16 in socket 10. Side portions of ramp-shaped edge surfaces 56 and 58 of heads 52 and 54 force arms 48 and 50 apart or open during insertion of daughtercard 16 into socket 10.

Figure 3:
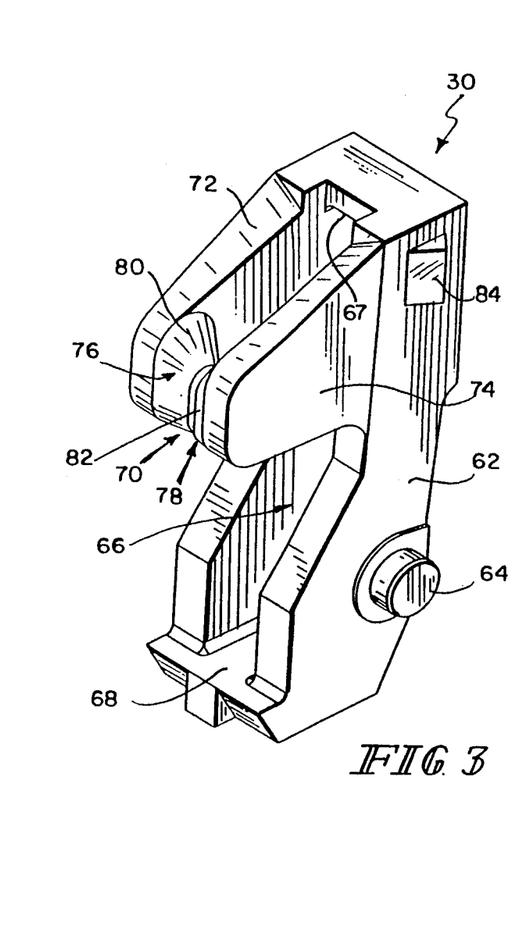
FIG. 3 is a perspective view of an insert configured to be coupled to the second end of the housing to provide the retention means and to provide a stable fixed post for guiding insertion of the daughtercard into the socket.

The tapered or ramped surfaces 56, 58, 80, and 82 of heads 52, 54, 76, and 78, respectively, provide a "lead in" geometry and stress distribution during displacement. The three tapered sides (top and two opposite sides) of ramp surfaces 56, 58, 80, and 82 are provided to retain daughtercard 16 in socket 10 without increasing the insertion force of daughtercard 16.

A triangular-shaped wedge 60 is formed on each side of body 32 to help secure ejector 10 within socket 10. As illustrated in FIG. 1, wedges 60 on opposite sides of body portion 32 engage sidewalls 26 of housing 12. Ejector 10 is inserted from the top of socket 10 into openings 24 and 26 until axles 35 snap into the preformed openings 24 and 26 of housing 12.

FIG. 3 illustrates insert post 30 for forming the rigid, fixed post 30 at second end 22 of socket 10. Post 30 includes a body portion 62 and a pair of axles 64 formed on opposite sides of body portion 62. The configuration of body portion 62 and axles 64 are similar to the configuration of body portion 32 and axles 35 of ejector 28. Therefore, post 30 can be inserted into either the first or second ends 20 or 22 of socket 10. Post 30 does not include a head portion such as head 34 of ejector 28. Post 30 does not move relative to socket 10. In other words, post 30 is in a fixed position relative to housing 12.

Post 30 provides retention means at the opposite end of housing 12 from ejector 28. Post 30 also provides a guide for insertion of daughtercard 16 into socket 10. Post 30 is formed to include a slot 66 for receiving an end edge portion of daughtercard 16 therein as daughtercard 16 is inserted into socket 10. An end edge 93 of daughtercard 16 is aligned with wall 67 of post 30 during insertion of daughtercard 16 into socket 10 to align the plurality of contact surfaces of daughtercard 16 with the plurality of terminals 18 of socket 10.

Retention post 30 is shown without a polarization cross member 45. It is understood that insert 30 may be formed to include a polarization cross member such as cross member 45 illustrated in FIG. 2. In that instance, ejector 28 at the opposite end of socket 10 would not include a cross member 45. Only one polarization cross member 45 is provided. A bottom surface 68 of post 30 engages a bottom surface of daughtercard 16 when daughtercard 16 is fully inserted into socket 10.

Body portion 62 of post 30 is formed to include a pair of flexible arms 72 and 74 that project away from body portion 62. Arms 72 and 74 are each formed to include tapered heads 76 ad 78, respectively, which engage opposite sides of daughtercard 16 to retain daughtercard 16 in socket 10. Ramp-shaped edge surfaces 80 and 82 of heads 76 and 78, respectively, force arms 72 and 74 apart during insertion or extraction of daughtercard 16 from socket 10. A triangular-shaped wedge 84 is formed on each side of body 62 to help secure retention post 30 within socket 10.

The present invention provides flexibility for inserting ejector 28 and retention post 30 into socket 10. Since socket 10 is symmetrical, ejector 28 and retention post 30 can be selectively inserted into either first end 20 or second end 22 of socket 10. Therefore, although FIG. 1 illustrates the invention with ejector 28 coupled to first end 20 of socket 10 and retention post 30 coupled to second end 22 of socket 10, it is understood that the locations of ejector 28 and retention post 30 could be reversed. The provision of fixed retention post 30 opposite from ejector 28 provides numerous advantages during insertion of daughtercard 16 into socket 10 or during removal of daughtercard 16 from socket 10 as discussed below. One advantageous feature of socket 10 which includes post 30 and ejector 28 is that socket 10 requires less board space on the mother board.

Figure 4:
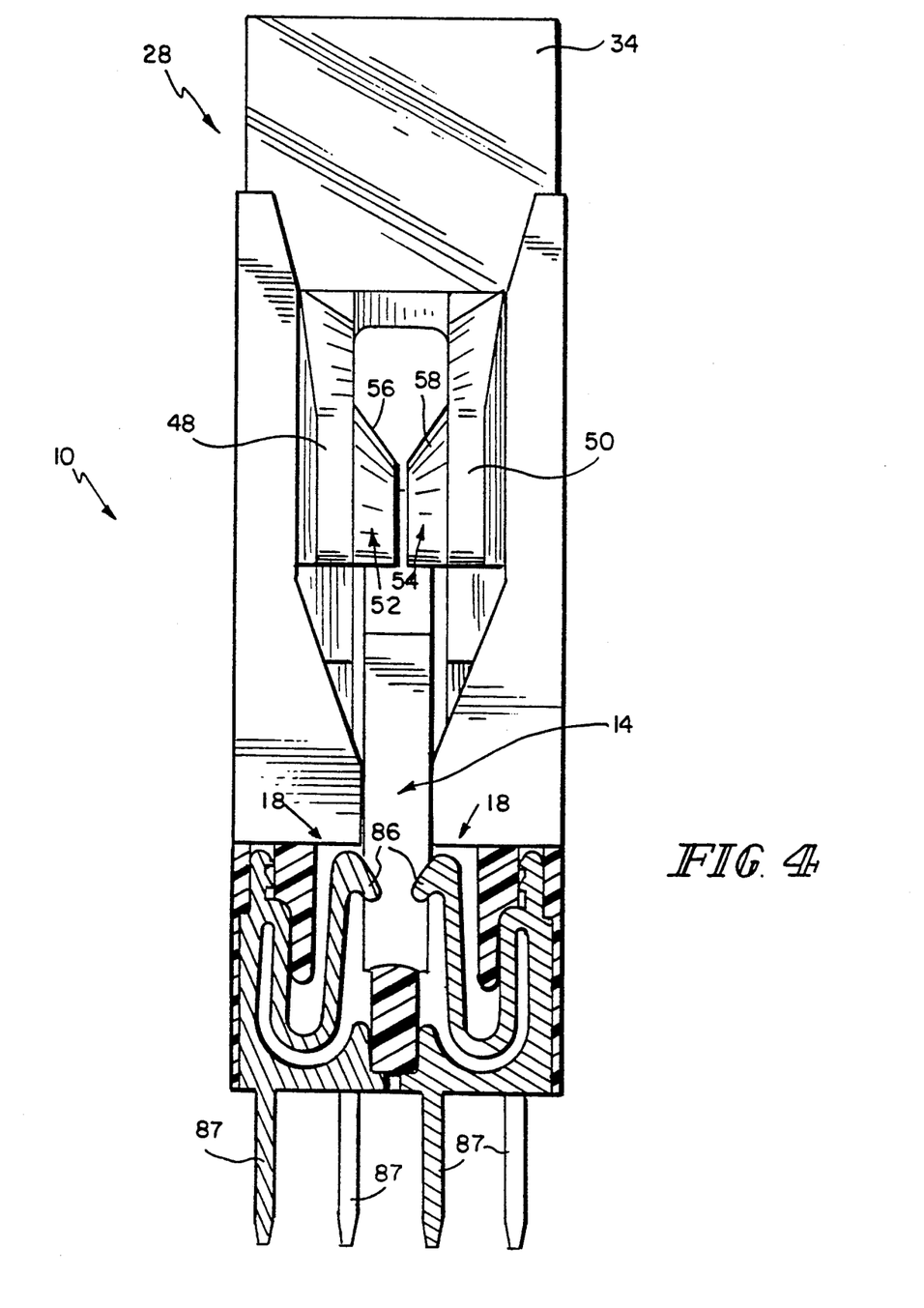
FIG. 4 is a sectional view taken along lines 4—4 of FIG. 1 illustrating the configuration of the contacts inside the socket and further illustrating the configuration of the ejector apparatus.

FIG. 4 illustrates the configuration of terminals 18 within socket 10 and further illustrates the configuration of ejector 28. Terminals 18 include contact surfaces 86 which extend into slot 14 to engage conductive surfaces on opposite sides of daughtercard 16 when daughtercard 16 is inserted into slot 14. Terminals 18 also include contact tails 87 for electrically coupling terminals 18 to the mother board (not shown). The configuration of terminals 18 is discussed in detail in co-pending U.S. Patent Application Serial No. 07/759,409, owned by the assignee of the present invention and incorporated herein by reference. It is understood, however, that various other terminal configurations may be used in accordance with the present invention. In other words, the present invention is not limited by the specific configuration of terminals 18.

Figure 5:
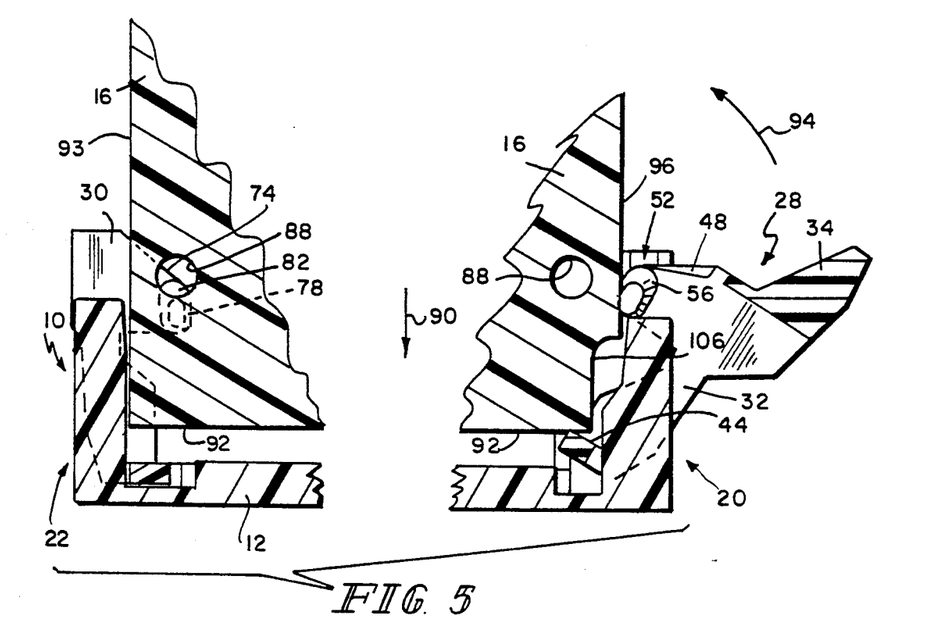
FIG. 5 is a diagrammatical view illustrating insertion of a daughtercard into the socket of the present invention.
Figure 5A:
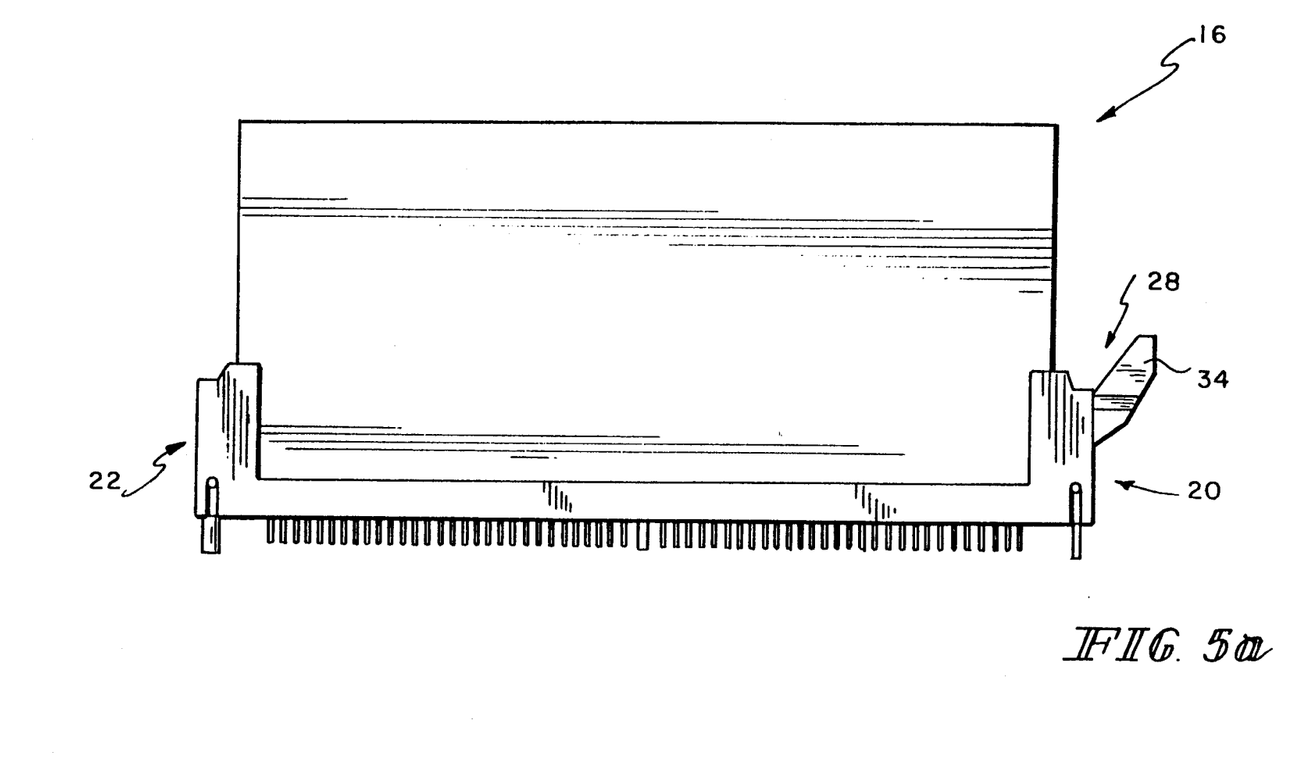
FIG. 5a is a view of the daughtercard inserted into the socket.

Insertion of daughtercard 16 into the socket 10 is illustrated in FIG. 5. Daughtercard 16 is formed to include apertures 88 therein. An end edge 93 of daughtercard 16 is first aligned with socket 10 using the fixed retention post 30 as a guide. Using post 30 as an alignment guide for inserting daughtercard 16 advantageously aligns conductive surfaces on daughtercard 16 with terminals 18 of socket 10. This is an advantage over the device disclosed in U.S. Pat. No. 5,074,800 are discussed above. In the device disclosed in the Sasao '800 patent, the circuit board may become misaligned with the socket due to the end play caused by having ejection levers with the socket at both ends of the socket. The present invention advantageously reduces the likelihood of misalignment between daughtercard 16 and socket 10 by providing fixed retention post insert 30 which is used as an insertion alignment guide.

As daughtercard 16 is inserted into socket 10 in the direction of arrow 90 of FIG. 5, bottom surface 92 of daughtercard 16 engages bottom surface 44 of ejector 28 and causes rotation of ejector 28 about pivot axis 36 in the direction of arrow 94. The ramped surfaces 56 and 58 on heads 52 and 54, respectively, cause arms 48 and 50 to move apart automatically as they contact a side edge 96 of daughtercard 16. There is no need to exert an external force on ejector 28 to cause ejector 28 to pivot to the retention position illustrated in FIG. 6. Ramped heads 56 and 58 enter aperture 88 from opposite sides of daughtercard 16 to stabilize and retain daughtercard 16 within socket 10. Heads 76 and 78 of arms 72 and 74, respectively, formed integrally with fixed retention post also enter an aperture 88 of daughtercard 16.

Figure 6:
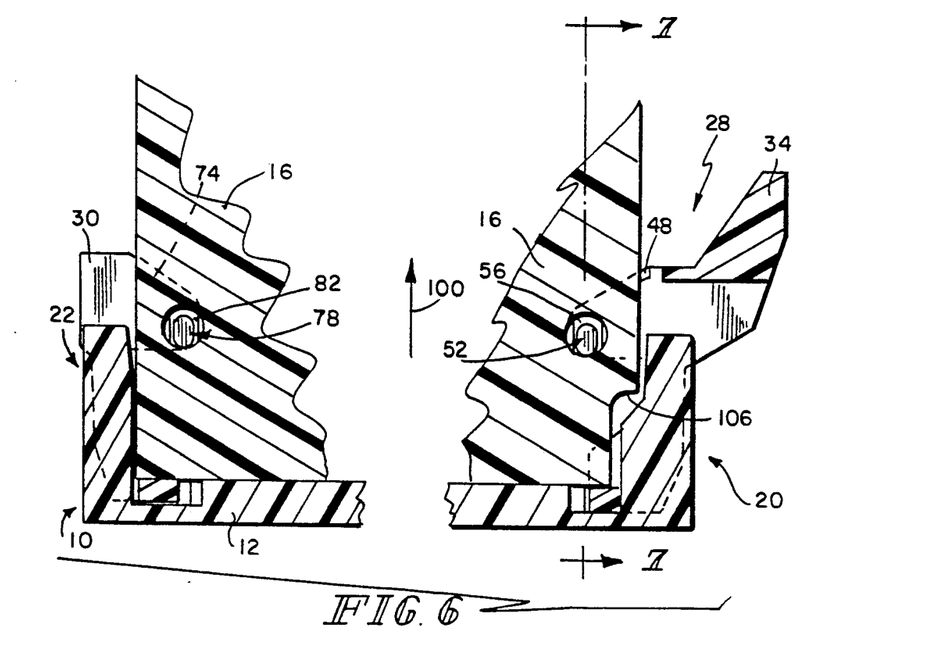
FIG. 6 is a diagrammatical view similar to FIG. 5 illustrating the position of the daughtercard in socket after the daughtercard is completely inserted into the socket.
Figure 7:
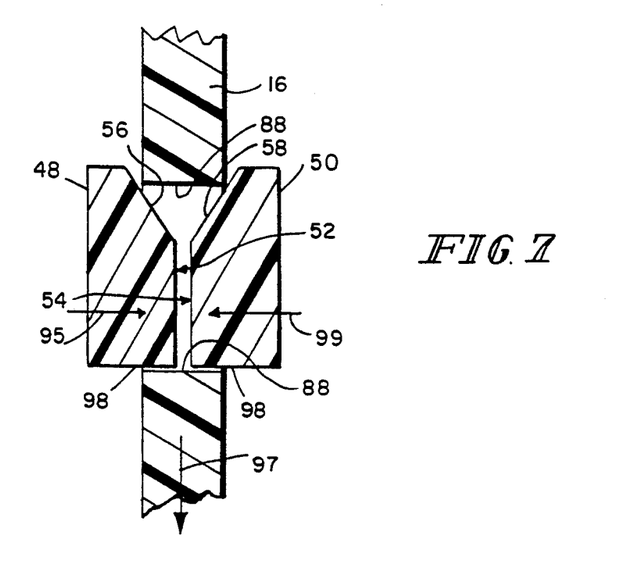
FIG. 7 is a sectional view taken along lines 7—7 of FIG. 6.

Daughtercard 16 is illustrated in the fully inserted position in FIG. 6. Heads 52 and 54 of ejector 28 and heads 76 and 78 of post 30 are designed to increase retention of daughtercard 16 within socket 10 during movement, vibration or shock of socket 10 which can occur under rigid mechanical conditions, during movement, or during operation of a motor or fan adjacent socket 10. Heads 52, 54, 76 and 78 apply both a horizontal retention force and a vertical retention force against daughtercard 16. FIG. 7 illustrates engagement of heads 52 and 54 of ejector 28 with daughtercard 16. It is understood that the engagement of heads 76 and 78 of post 30 is identical to the description of heads 52 and 54. Therefore, only a description of heads 52 and 54 will be provided.

As illustrated in FIG. 7, ramped surface 56 of head 52 engages a sidewall defining aperture 88 in daughtercard 16 and spring arm 48 applies a force normal to daughtercard 16 in the direction of arrow 95. In addition, bottom surface 98 of head 52 provides a downwardly-directed vertical retention force to daughtercard 16 as illustrated by arrow 97 to hold daughtercard 16 in socket 10. Ramped surface 58 of head 54 engages an opposite side of daughtercard 16 so that spring arm 50 applies a normal force against daughtercard 16 in the direction of arrow 99. In addition, bottom surface 98 of head 54 enters aperture 88 to provide a downwardly-directed vertical retention force to daughtercard 16 in the direction of arrow 97.

Heads 52 and 54 of ejector 28 and heads 76 and 78 of post 30 provide a retention force on daughtercard 16 without the use of a latch which the user must manually displace in order to remove daughtercard 16 from socket 10. A computer in which socket 10 is installed can be subjected to an increased amount of shock and vibration due to movement of the computer or due to motor or fan vibration without dislocating daughtercard 16 from socket 10. Therefore, the configuration of socket 10 reduces the likelihood of intermittent or failed signal paths from daughtercard 16 to the mother board while facilitating removal of daughtercard 16 from socket 10. Ramped surfaces 56 and 58 of heads 52 and 54 are configured to allow for locational and size tolerances of aperture 88 formed in daughtercard 16.

Figure 8:
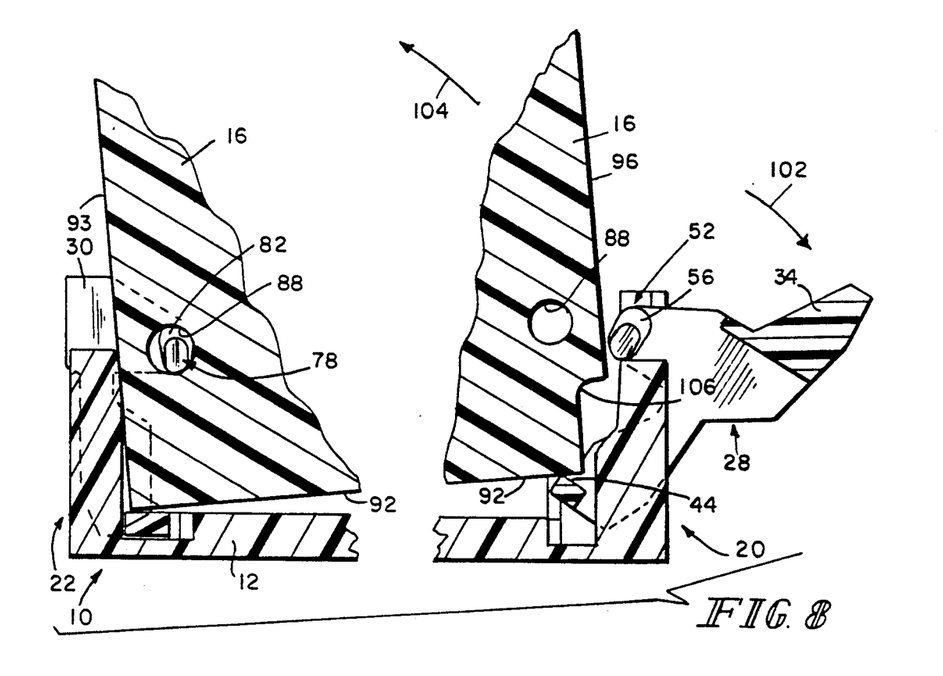
FIG. 8 is a diagrammatical view similar to FIGS. 5 and 6 illustrating ejection of the daughtercard from the socket using the ejector apparatus of the present invention.

When it is desired to remove daughtercard 16 from socket 10, ejector 28 is rotated about pivot axis 36 in the direction of arrow 102 of FIG. 8. This movement of ejector 28 forces the end of daughtercard 16 adjacent ejector 28 to move in the direction of arrow 104 out of socket 10. As illustrated in FIG. 8, an opposite end of daughtercard 16 adjacent post 30 remains in elongated slot 14 of socket 10 during movement of ejector 10 in the direction of arrow 102. Therefore, daughtercard pivots about bottom surface 92 of end edge 93 adjacent post 30 during ejection.

Side portions of ramped surfaces 56 and 58 of heads 52 and 54, respectively, engage a side wall defining aperture 88 to force spring arms 48 and 50 outwardly to disengage heads 52 and 54 of ejector 28 from aperture 88 automatically upon movement of ejector 28 in the direction of arrow 102. After bottom surface 44 of ejector 28 pushes the end of daughtercard 16 adjacent ejector 28 out of elongated slot 14 in the direction of arrow 104, an operator can grab the raised corner of daughtercard 16 and "peel" daughtercard 16 the rest of the way out socket 10 by continuing to rotate daughtercard 16 in the direction of arrow 104 using fixed retention post insert 30 to provide leverage. Ejector 28 of the present invention provide a mechanical advantage during ejection of daughtercard 16 and advantageously does not stress socket 10 or the solder joints coupling socket 10 to the mother board.

FIGS. 5, 6, and 8 illustrate a polarization notch 106 formed in daughtercard 16 for use with polarization cross member 45 of ejector 28 to polarize daughtercard 16 in socket 10. It is understood that if a cross member is used on post 30 instead of ejector 28 that the polarization of daughtercard 16 would be reversed.

Although the invention has been described in detail with reference to a certain preferred embodiment, variations and modifications exist within the scope and spirit of the invention as described and defined in the following claims.

What is claimed is:

1. An electrical connector for receiving a daughtercard having a plurality of conductive surfaces formed thereon, the connector comprising:

a socket having a first end and a second end, the socket being formed to include an elongated slot extending between the first and second ends for receiving the daughtercard therein and including a plurality of electrical terminals for engaging the plurality of conductive surfaces formed the daughtercard for electrically coupling the daughtercard to the socket;

an ejector coupled to the first end of the socket, the ejector including first and second spring arms for engaging opposite sides of the daughtercard upon insertion of the daughtercard into the socket to retain the daughtercard within the socket, and including means for engaging the daughtercard to force an end of the daughtercard adjacent the ejector out of the elongated slot upon movement of the ejector relative to the socket; and a post coupled to the second end of the socket in a fixed position relative to the socket to guide insertion of the daughtercard into the socket so that the plurality of conductive surfaces formed the daughtercard are aligned with the plurality of electrical terminals of the socket, the post being formed to include a pair of spring arms projecting away from the post for engaging opposite sides of the daughtercard adjacent the second end of the socket to retain the daughtercard within the socket.

2. The connector of claim 1, wherein the post is formed by a separate post insert located in an opening formed at the second end of the socket.

3. The connector of claim 1, wherein the ejector is formed to includes means for polarizing the daughtercard in the socket.

4. The connector of claim 1, wherein the post is formed to includes means for polarizing the daughtercard in the socket.

5. The connector of claim 1, wherein the ejector is pivotably coupled to the first end of the socket and movable from an upright retention position in which the spring arms of the ejector engage opposite sides of the daughtercard to retain the daughtercard in the socket to an outwardly pivoted ejection position to force said end of the daughtercard adjacent the ejector out of the elongated slot.

6. The connector of claim 5, wherein the spring arms of the ejector are formed to include means for permitting the daughtercard to be inserted into the socket with the ejector in either its upright retention position or its outwardly pivoted ejection position.

7. The connector of claim 5, wherein the ejector includes a body portion and a pair of axles formed on opposite sides of the body portion, the axles defining a pivot axis normal a longitudinal axis of the socket, the ejector also being formed to include a slot therein for receiving an edge portion of the daughtercard as the daughtercard is inserted into the socket.

8. The connector of claim 7, wherein the ejector includes a bottom surface configured to engage a bottom surface of the daughtercard and force the end of the daughtercard adjacent the first end of the socket out of the elongated slot of the socket upon pivotal movement of the ejector relative to the socket.

9. The connector of claim 1, wherein the first and second spring arms of the ejector each include a head portion for engaging opposite sides of the daughtercard.

10. The connector of claim 9, wherein the head portions of the ejector are configured enter an aperture formed in the daughtercard from opposite sides of the daughtercard to retain and stabilize the daughtercard in the socket.

11. The connector of claim 10, wherein the head portions include a ramp shaped edge surface configured to engage the daughtercard and apply a force normal to the daughtercard and a bottom surface for applying a force against the daughtercard downwardly into said elongated slot of the socket.

12. The connector of claim 9, wherein the head portions include side ramped surfaces to force the first and second spring arms of the ejector apart automatically during insertion of the daughtercard into socket.

13. The connector of claim 12, wherein the side ramped surfaces engage a side wall defining the aperture in the daughtercard to force the spring arms of the ejector apart to disengage the head portions of the ejector from the aperture during ejection of the daughtercard from the socket.

14. The connector of claim 1, wherein the spring arms of the post each include a head portion for engaging opposite sides of the daughtercard to retain and stabilize the daughtercard in the socket.

15. The connector of claim 14, wherein the head portions of the post spring arms are configured enter an aperture formed in the daughtercard adjacent the second end of the socket from opposite sides of the daughtercard to retain and stabilize the daughtercard in the socket.

16. The connector of claim 15, wherein the head portions of the post spring arms include a ramp shaped edge surface configured to engage the daughtercard and apply a force normal to the daughtercard and a bottom surface for applying a force against the daughtercard downwardly into said elongated slot of the socket.

17. The connector of claim 15, wherein the head portions of the post spring arms include side ramped surfaces to force the post spring arms apart automatically during insertion of the daughtercard into the socket.

18. The connector of claim 15, wherein the side ramped surfaces engage a side wall defining the aperture in the daughtercard to force the post spring arms apart to disengage the head portions of the post spring arms from the aperture during ejection of the daughtercard from the socket.

19. An electrical connector for receiving a daughtercard having a plurality of conductive surfaces formed thereon, the connector comprising:

a socket having a first end and a second end, the socket being formed to include an elongated slot extending between the first and second ends for receiving the daughtercard therein and including a plurality of electrical terminals for engaging the plurality of conductive surfaces formed the daughtercard for electrically coupling the daughtercard to the socket;

a post coupled to the second end of the socket in a fixed position relative to the socket to guide insertion of the daughtercard into the socket so that the plurality of conductive surfaces formed the daughtercard are aligned with the plurality of electrical terminals of the socket, the post being formed to include means for engaging opposite sides of the daughtercard adjacent the post to retain the daughtercard within the socket; and an ejector coupled to the first end of the socket, the ejector including means for retaining the daughtercard in the socket upon insertion of the daughtercard into the socket and means for ejecting an end of the daughtercard adjacent the ejector out of the elongated slot upon movement of the ejector relative to the socket while leaving an opposite end of the daughtercard adjacent the post in the elongated slot of the socket.

20. The connector of claim 19, wherein the ejector is formed to includes means for polarizing the daughtercard in the socket.

21. The connector of claim 19, wherein the post is formed to includes means for polarizing the daughtercard in the socket.

22. The connector of claim 19, wherein the retaining means of the ejector includes first and second spring arms for engaging opposite sides of the daughtercard upon insertion of the daughtercard into the socket.

23. The connector of claim 22, wherein the first and second spring arms of the ejector each include a head portion configured to enter an aperture formed in the daughtercard adjacent the ejector from opposite sides of the daughtercard, the head portions including a ramp shaped edge surface configured to engage the daughtercard and apply a force normal to the daughtercard and a bottom surface for applying a force against the daughtercard downwardly into said elongated slot of the socket.

24. The connector of claim 23, wherein the head portions include side ramped surfaces to force the first and second spring arms of the ejector apart automatically during insertion of the daughtercard into socket or during ejection of the daughtercard from the socket.

25. The connector of claim 19, wherein the ejecting means includes means for engaging the daughtercard to force an end of the daughtercard adjacent the first end of the socket out of the elongated slot upon movement of the ejector relative to the socket.

26. The connector of claim 25, wherein the ejector is pivotably coupled to the first end of the socket and movable from an upright retention position in which the retaining means engages opposite sides of the daughtercard to retain the daughtercard in the socket to an outwardly pivoted ejection position so that the ejecting means forces said end of the daughtercard adjacent the ejector out of the elongated slot.

27. The connector of claim 26, wherein the spring arms of the ejector are formed to include means for permitting the daughtercard to be inserted into the socket with the ejector in either its upright retention position or its ejection position.

28. The connector of claim 19, wherein the engaging means of the post includes a pair of spring arms projecting away from the post for engaging opposite sides of the daughtercard adjacent the second end of the socket to retain the daughtercard within the socket.

29. The connector of claim 28, wherein the spring arms of the post each include a head portion configured to enter an aperture formed in the daughtercard to retain and stabilize the daughtercard in the socket, the head portions of the post spring arms including a ramp shaped edge surface configured to engage the daughtercard and apply a force normal to the daughtercard and a bottom surface for applying a force against the daughtercard downwardly into said elongated slot of the socket.

30. The connector of claim 29, wherein the head portions of the post spring arms include side ramped surfaces to force the post spring arms apart automatically during insertion of the daughtercard into the socket or during ejection of the daughtercard from the socket.

* * * * *